US00RE49133E

(19) United States
(12) Reissued Patent
Law

(10) Patent Number: US RE49,133 E
(45) Date of Reissued Patent: Jul. 12, 2022

(54) HOST-CONTROLLED GARBAGE COLLECTION

(71) Applicant: Kioxia Corporation, Tokyo (JP)

(72) Inventor: Sie Pook Law, San Jose, CA (US)

(73) Assignee: Kioxia Corporation, Tokyo (JP)

(21) Appl. No.: 16/515,345

(22) Filed: Jul. 18, 2019

Related U.S. Patent Documents

Reissue of:
(64) Patent No.: 9,910,622
Issued: Mar. 6, 2018
Appl. No.: 15/177,144
Filed: Jun. 8, 2016

U.S. Applications:
(63) Continuation of application No. 14/288,208, filed on May 27, 2014, now Pat. No. 9,383,926.

(51) Int. Cl.

| | |
|---|---|
| ***G06F 12/00*** | (2006.01) |
| ***G06F 13/42*** | (2006.01) |
| ***G11C 16/10*** | (2006.01) |
| ***G11C 16/16*** | (2006.01) |

(Continued)

(52) U.S. Cl.
CPC ..... *G06F 3/0653* (2013.01); *G06F 3/061* (2013.01); *G06F 3/0604* (2013.01); *G06F 3/064* (2013.01); *G06F 3/067* (2013.01); *G06F 3/0608* (2013.01); *G06F 3/0611* (2013.01); *G06F 3/0616* (2013.01); *G06F 3/0652* (2013.01); *G06F 3/0679* (2013.01); *G06F 3/0688* (2013.01); *G06F 12/0246* (2013.01); *G06F 12/0253* (2013.01); *G06F 13/4282* (2013.01); *G11C 16/10* (2013.01); *G11C 16/16* (2013.01); *G06F 2212/1016* (2013.01); *G06F 2212/1036* (2013.01); *G06F 2212/7201* (2013.01); *G06F 2212/7204* (2013.01); *G06F 2212/7205* (2013.01); *G06F 2212/7208* (2013.01); *G06F 2213/0028* (2013.01); *G06F 2213/0032* (2013.01)

(58) Field of Classification Search
CPC ..... G06F 12/0246; G06F 12/0253; G06F 12/0871; G06F 12/1425; G06F 3/061; G06F 3/0619; G06F 3/0652; G06F 3/0679; G06F 21/79
USPC ..... 711/102, 103, 113, 170, 193; 714/6.13, 714/15
See application file for complete search history.

(56) References Cited

U.S. PATENT DOCUMENTS

| | | | | |
|---|---|---|---|---|
| 6,449,625 | B1 * | 9/2002 | Wang | G06F 12/0246 |
| 7,464,216 | B2 * | 12/2008 | Gorobets | G06F 12/0253 711/103 |
| 7,899,987 | B2 | 3/2011 | Salomon et al. | |

(Continued)

OTHER PUBLICATIONS

Lee et al., "A Semi-Preemptive Garbage Collector for Solid State Drives," (ISPASS) Apr. 10-12, 2011, IEEE International Symposium, pp. 12-21 (Year: 2011).*

*Primary Examiner* — Christopher E. Lee
(74) *Attorney, Agent, or Firm* — Finnegan, Henderson, Farabow, Garrett & Dunner L.L.P.

(57) ABSTRACT

In an array of solid-state drives (SSDs), SSDs in the array are each configured to initiate generation of additional erased memory blocks when an initiation command is received from a host or when the number of erased memory blocks in the SSD falls below a minimum threshold of erased memory blocks for the SSD. The minimum threshold value may be adjusted by the host.

9 Claims, 5 Drawing Sheets

(51) Int. Cl.
*G06F 3/06* (2006.01)
*G06F 12/02* (2006.01)

(56) References Cited

U.S. PATENT DOCUMENTS 8,375,158 B2 * 2/2013 Cho ..... G06F 12/0246 711/103
8,751,727 B2 * 6/2014 Kawamura ..... G06F 3/0679 711/103
9,026,716 B2 * 5/2015 Kang ..... G06F 12/0246 711/103
2005/0204187 A1 * 9/2005 Lee ..... G06F 12/0246 714/6.13
2006/0161724 A1 * 7/2006 Bennett ..... G06F 12/0246 711/103
2006/0288153 A1 * 12/2006 Tanaka ..... G06F 12/1425 711/103
2007/0030734 A1 * 2/2007 Sinclair ..... G06F 3/0605 365/185.11
2009/0024787 A1 * 1/2009 Yim ..... G06F 12/0246 711/103
2010/0082890 A1 * 4/2010 Heo ..... G06F 12/0246 711/103
2010/0287217 A1 * 11/2010 Borchers ..... G06F 12/0246 707/813
2011/0246821 A1 * 10/2011 Eleftheriou ..... G06F 3/0619 714/15
2012/0072639 A1 * 3/2012 Goss ..... G06F 12/0246 711/103
2013/0166822 A1 * 6/2013 Franceschini ..... G06F 12/0246 711/103
2013/0268731 A1 10/2013 Boyd et al.
2014/0013032 A1 * 1/2014 Min ..... G06F 12/0246 711/103
2014/0082276 A1 * 3/2014 Suzuki ..... G06F 12/0871 711/113
2014/0101379 A1 * 4/2014 Tomlin ..... G06F 12/0246 711/103
2014/0215129 A1 * 7/2014 Kuzmin ..... G06F 12/0246 711/103
2014/0281338 A1 * 9/2014 Choi ..... G06F 3/061 711/170
2014/0281588 A1 * 9/2014 Vogan ..... G06F 21/79 713/193
2015/0127889 A1 * 5/2015 Hwang ..... G06F 12/0246 711/103
2015/0186056 A1 * 7/2015 Miura ..... G06F 3/0652 711/102

* cited by examiner

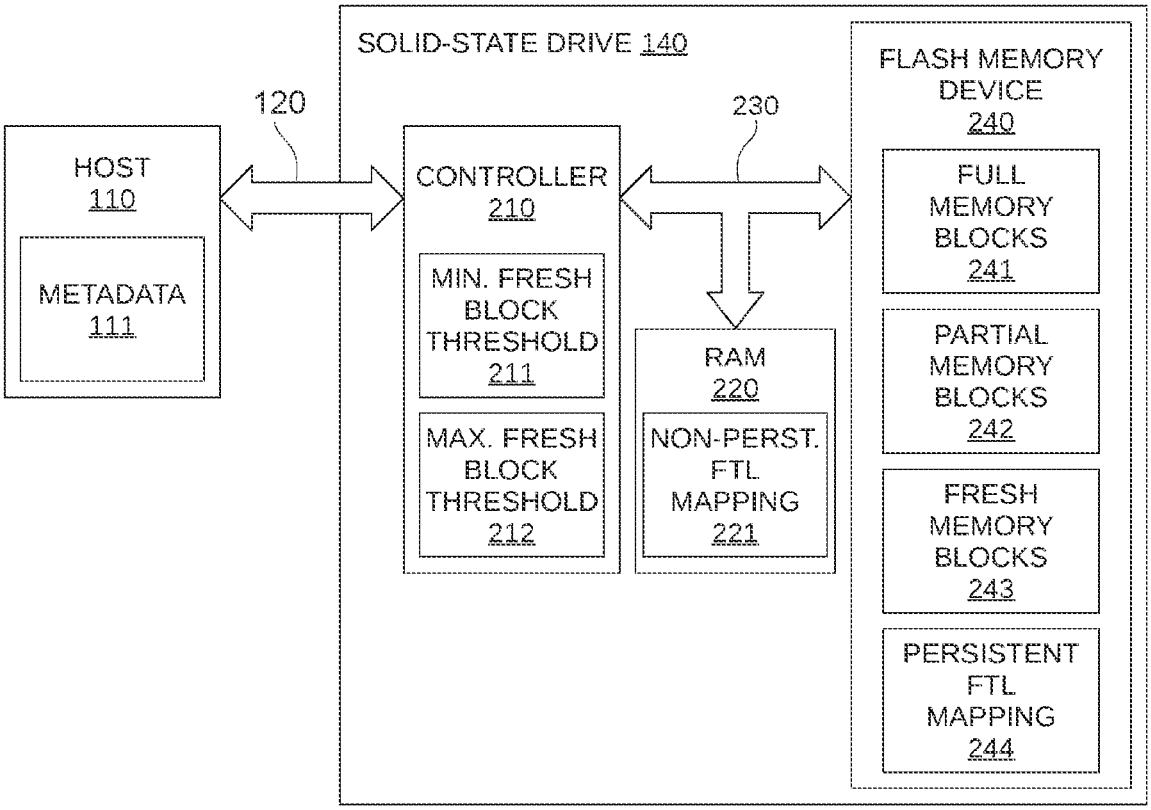
FIG. 2 (AMENDED)

HOST-CONTROLLED GARBAGE COLLECTION

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED [APPLICATION] *APPLICATIONS*

*Notice: More than one reissue application has been filed for the reissue of U.S. Pat. No. 9,910,622 B2. The reissue applications are application Ser. No.: 16/515,345 filed on Jul. 18, 2019, and application Ser. No.: 16/515,366 filed on Jul. 18, 2019. Both applications are reissue applications of U.S. Pat. No. 9,910,622 B2.*

[This application] *This is a reissue application of U.S. Pat. No. 9,910,622 B2, issued on Mar. 6, 2018, from U.S. patent application Ser. No. 15/177,144, which* is a continuation of U.S. patent application No. 14/288,208, filed on May 27, 2014, [the] *and issued on Jul. 5, 2016, as U.S. Pat. No. 9,383,926. The* entire contents of [which] *the above-identified applications* are incorporated herein by reference.

BACKGROUND

In enterprise data storage and distributed computing systems, banks or arrays of data storage devices are commonly employed to facilitate large-scale data storage for a plurality of hosts or users. Because latency is a significant issue in such computing systems, solid-state drives (SSDs) are commonly used as data storage devices, since data can be written to and read from the flash memory cells typically used in an SSD very quickly.

A significant drawback of SSDs is the periodic need for garbage collection, a process by which memory blocks in an SSD are made available for storing data. Flash memory cells typically used in an SSD can be written to in units referred to as pages (which are made up of multiple flash memory cells), but can only be erased in larger units referred to as memory blocks (which are made up of multiple pages). Thus, as a host deletes or updates pages of data in a particular memory block, the memory block becomes a partially utilized block that includes a combination of pages of data that are no longer needed by the host and pages of valid data that are still needed by the host. To make such a partially utilized block available for storing more data, garbage collection is used, in which the pages of valid data are read and copied into a previously erased memory block, along with pages of valid data from other partially utilized blocks. In this way, valid data from multiple partially utilized blocks can be consolidated into a single memory block, while the partially utilized blocks can be erased and made available for storing additional data. However, when garbage collection is performed to make memory blocks available in response to a write command, execution of the write command is slowed significantly, since existing data are read and rewritten to flash memory before the new data from the write command can be written.

In a personal computer, an SSD is configured to perform garbage collection as a background operation and thereby can impact SSD performance. In enterprise and cloud computing systems, high volume write activity is commonplace, and the need for garbage collection in some or all SSDs of a large-scale data storage system can be continuous. Consequently, for an SSD that is part of a large-scale data storage system, garbage collection frequently interferes with write commands issued to that SSD. This significantly reduces the performance of the system and is highly undesirable.

SUMMARY

One or more embodiments provide systems and methods for host-controlled garbage collection for an array of solid-state drives (SSDs). In some embodiments, SSDs in the array are each configured to initiate generation of additional erased memory blocks when an initiation command is received from a host or when the number of erased memory blocks in the SSD falls below a minimum threshold of erased memory blocks for the SSD. In some embodiments, the minimum threshold value is adjusted by the host.

A data storage device, according to embodiments, comprises a non-volatile solid-state device, and a controller. In one embodiment, the controller is configured to initiate a process for generating erased blocks when an initiation command is received from a host and to set a minimum threshold value, wherein the minimum threshold value is received from the host and indicates a number of erased blocks present in the non-volatile solid-state storage device below which the controller begins generating erased blocks in the non-volatile solid-state storage device.

A data storage system, according to embodiments, comprises an array of data storage devices, each data storage device including a non-volatile solid-state storage device and a controller. In one embodiment, the controller is configured to initiate a process for generating erased blocks when an initiation command is received from a host and to set a minimum threshold value, wherein the minimum threshold value is received from the host and indicates a number of erased blocks present in the non-volatile solid-state storage device below which the controller begins generating erased blocks in the non-volatile solid-state storage device.

Further embodiments provide a method of operating a storage device having a non-volatile solid-state device. The method comprises the steps of sending an inquiry to a first non-volatile solid-state device in the pool of non-volatile solid-state devices for a number of erased memory blocks in the first non-volatile solid-state device, receiving from the first non-volatile solid-state device the number of erased memory blocks in the first non-volatile solid-state device, writing to the first non-volatile solid-state device a quantity of data equal to or less than the number of erased memory blocks received from the first non-volatile solid-state device, in response to an acknowledgement that writing the quantity of data to the first non-volatile solid-state device has completed, sending a command to the first non-volatile solid-state device to begin generating erased memory blocks in the first non-volatile solid-state device, and, while writing the quantity of data to the first non-volatile solid-state device, sending an inquiry to a second non-volatile solid-state device in the pool of non-volatile solid-state devices for a number of erased memory blocks in the second non-volatile solid-state device.

In a data storage system that includes an array of non-volatile solid-state storage devices, further embodiments provide a method of storing data in response to a write command from a host. The method comprises the steps of storing data associated with the write command in a first non-volatile solid-state storage device in the array, reporting a number of available memory blocks in a second non-volatile solid-state storage device in the array while storing data associated with the write command in the first non-volatile solid-state storage device, after storing data associated with the write command in the first non-volatile solid-state device, storing data associated with the write command in the second non-volatile solid-state storage device, receiving a command from the host to initiate generation of available memory blocks in the first non-volatile solid-state storage device, and, while storing data associated with the write command in the second non-volatile solid-state storage device, initiating generation of available memory blocks in the first non-volatile solid-state storage device.

BRIEF DESCRIPTION OF THE DRAWINGS

FIG. 2 illustrates an operational diagram of a solid-state drive (SSD), configured according to one embodiment.

DETAILED DESCRIPTION

Figure 1:
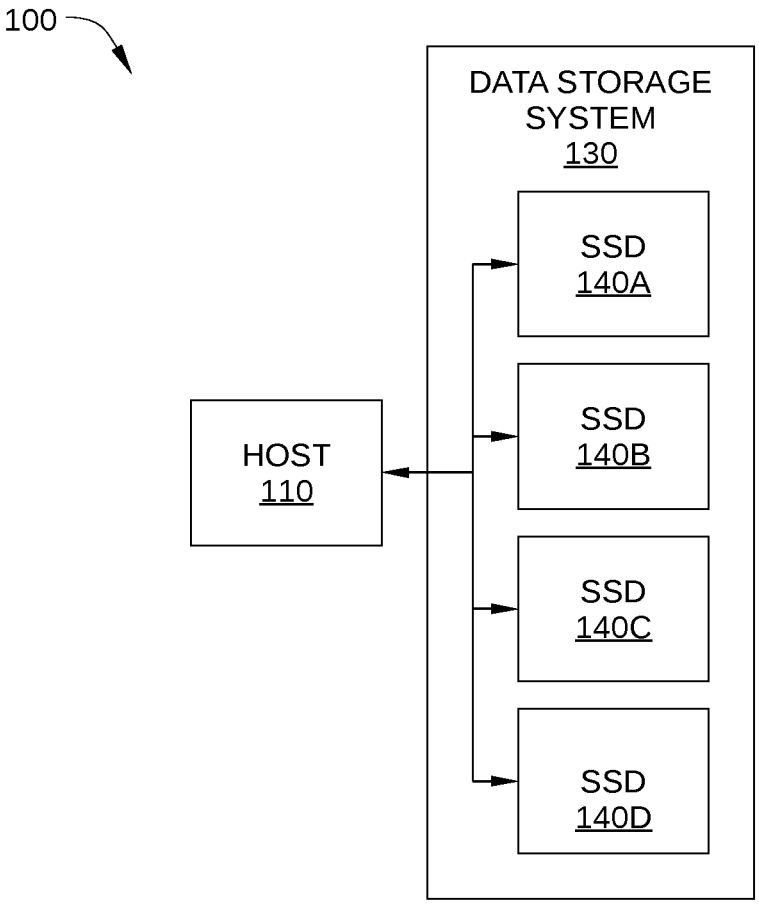
FIG. 1 illustrates a portion of an enterprise storage system or distributed (cloud) computing system.

FIG. 1 illustrates a portion 100 of an enterprise storage system or distributed (cloud) computing system. Portion 100 includes a host 110, a host interface network 120, and a data storage system 130. Data storage system 130 includes an array or pool of solid-state drives (SSDs) 140A-140D, and is connected to a host 110, such as a host computer or cloud computing customer, via host interface network 120. While data storage system 130 in FIG. 1 only includes four SSDs, in large-scale data storage applications, data storage system 130 may include many more SSDs, for example 50 or more. In some embodiments, host interface network 120 may include any technically feasible system interface, including a serial advanced technology attachment (SATA) bus, a serial attached SCSI (SAS) bus, a non-volatile memory express (NVMe) bus, and the like. In some embodiments, each of SSDs 140A-140D may be identical and in other embodiments SSDs 140A-140D may form a heterogeneous array. One embodiment of an SSD that may be implemented as one or more of SSDs 140A-140D is described in conjunction with FIG. 2.

FIG. 2 illustrates an operational diagram of an SSD 140. As shown, SSD 140 includes a drive controller 210, a random access memory (RAM) 220, a high-speed data path 230, and a flash memory device 240. SSD 140 may be a data storage device included in an array of data storage devices, such as data storage system 130 in FIG. 1. High-speed data path 230 may be any high-speed bus known in the art, such as a double data rate (DDR) bus, a DDR2 bus, a DDR3 bus, or the like.

Drive controller 210 is configured to control operation of SSD 140, and is connected to RAM 220 and flash memory device 240 via high-speed data path 230. Drive controller 210 may also be configured to control interfacing of SSD 140 with host 110. Some or all of the functionality of drive controller 210 may be implemented as firmware, application-specific integrated circuits, and/or a software application. In some embodiments, drive controller 210 includes a minimum erased block threshold 211 and a maximum erased block threshold 212. In some embodiments, host 110 includes metadata 111, which may be a file system map and/or other metadata for data stored by host 110 in data storage system 130. Metadata 111 indicates which of SSDs 140A-140D host 110 has employed to store each block of data stored in data storage system 130. For example, metadata 111 may map each logical block address (LBA) that host 110 has stored in system 130 to a particular one of SSDs 140A-140D.

Minimum erased block threshold 211 includes a value that indicates a number of erased memory blocks 243 in flash memory device 240. When drive controller 210 determines that the number of erased memory blocks 243 is less than minimum erased block threshold 211, drive controller 120 initiates generation of additional available memory blocks in flash memory device 240, i.e., drive controller 120 performs a garbage collection process to generate additional erased memory blocks 243. Similarly, maximum erased block threshold 212 includes a value that indicates a number of erased memory blocks 243 in flash memory device 240. When drive controller 120 determines that the number of erased memory blocks 243 is greater than or equal to maximum erased block threshold 212, drive controller 120 halts generation of additional available memory blocks in flash memory device 240.

RAM 220 is a volatile solid-state memory device, such as a dynamic RAM (DRAM). RAM 220 is configured for use as a data buffer for SSD 140, temporarily storing data received from host 110. In addition, RAM 220 is configured to store a non-persistent FTL map 221. Non-persistent FTL map 221 is a data structure that maps logical block addresses (LBAs) stored in SSD 140 to respective physical memory locations (e.g., memory addresses) in flash memory device 240. To reduce latency associated with SSD 140 and to extend the lifetime of flash memory device 240, non-persistent FTL map 221 includes the most up-to-date mapping of LBAs stored in SSD 140 to physical memory locations in flash memory device 240. Latency associated with SSD 140 is reduced because reads from RAM 220 in response to a command from host 110 are generally faster than reads from flash memory device 240. Lifetime of flash memory device 240 is extended by modifying non-persistent FTL map 221 during normal operation of SSD 140 and only periodically replacing persistent FTL map 244 in flash memory device 240; constantly updating persistent FTL map 244 results in significant wear to the memory cells of flash memory device 240.

Flash memory device 240 is a non-volatile solid-state storage medium, such as a NAND flash chip, that can be electrically erased and reprogrammed. For clarity, SSD 140 is illustrated in FIG. 2 as a single flash memory device 240, but in some embodiments, SSD 140 may include multiple flash memory devices 240. Flash memory device 240 is configured to store persistent FTL map 244, as shown. Similar to non-persistent FTL map 221 stored in RAM 220, persistent FTL map 244 is a data structure that maps LBAs stored in SSD 140 to respective physical memory locations in flash memory device 240. Because the contents of persistent FTL map 244 are stored in flash memory device 240, said contents are persistent after powering down SSD 140 and after power loss to SSD 140.

Flash memory device 240 includes a plurality of memory cells, typically NAND flash memory cells, that are grouped into readable and writable pages, typically 4 to 16 kB each. These pages are organized into memory blocks (typically 128 to 512 pages per block, e.g. totaling 512 kB per block), which are typically the smallest erasable unit in a NAND memory device. Because the individual pages of these memory blocks can only be directly written to when erased, an entire memory block is erased before being re-used to store new data. Thus, when an individual page of data is updated by host 110, that page of data cannot be overwritten at the same location in flash memory device 240. Instead, the page of data is written to a different location in flash memory device 240 (typically in a completely different memory block), and non-persistent FTL map 221 is updated accordingly. Consequently, during normal operation flash memory device 240 includes erased memory blocks 243, partial memory blocks 242 that are partially filled with pages of valid data and partially filled with pages of invalid or obsolete data, and full memory blocks 241 that only include pages of valid data. Examples of full memory blocks 241, partial memory blocks 242, and erased memory blocks 243 are described in greater detail below in conjunction with FIG. 3.

In FIG. 2, persistent FTL map 244 is schematically depicted along with full memory blocks 241, partial memory blocks 242, and erased memory blocks 243 in flash memory device 240. In practice persistent FTL map 244, which generally represents data, is actually stored in pages included in full memory blocks 241 and/or partial memory blocks 242.

Figure 3:
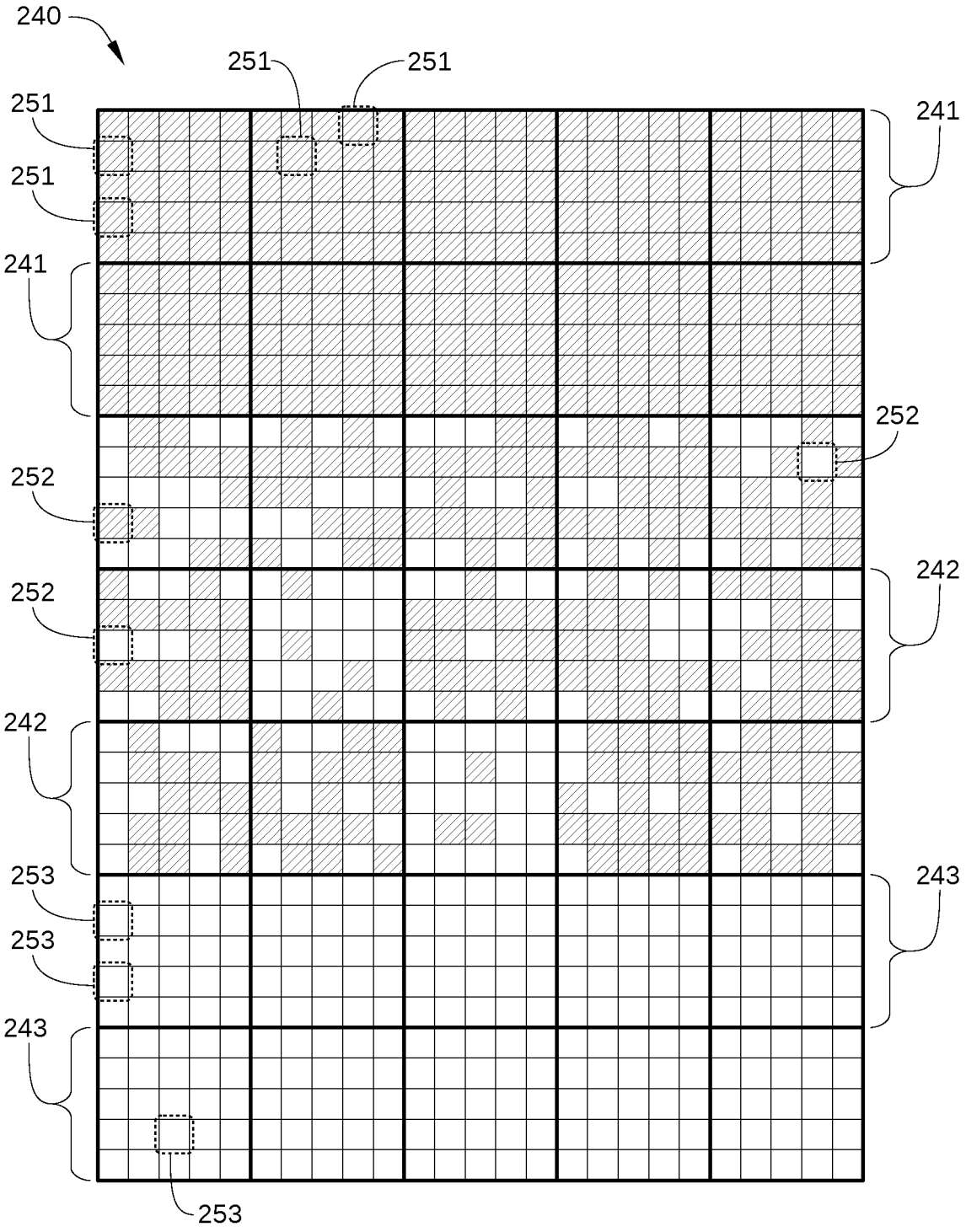
FIG. 3 schematically illustrates the various memory blocks in a flash memory device of the SSD in FIG. 2.

FIG. 3 schematically illustrates the various memory blocks in flash memory device 240 of SSD 140. As shown, flash memory device 240 includes full memory blocks 241, partial memory blocks 242, and erased memory blocks 243. Full memory blocks 241 are memory blocks that are completely filled memory blocks, and include only valid pages 251, which are pages that include valid data stored by host 110. Full memory blocks 241 represent completely filled with valid pages 251 as a result of either a garbage collection process or of not having any pages included therein updated or deleted by host 110 after being filled with valid data. Partial memory blocks 242 represent memory blocks that include a combination of valid pages 251 and invalid pages 252, where invalid pages 252 are pages of obsolete or invalid data, such as data that have been deleted or updated by host 110. Generally, partial memory blocks 242 are formed as a result of host 110 updating and deleting data stored in valid pages 251 of a full memory block 241. Erased memory blocks 243 represent memory blocks that include only erased pages 253. Alternatively, in some embodiments, erased memory blocks 243 also represent memory blocks that include only invalid pages 252, which can be erased immediately prior to writing data to a particular erased memory block 243 without the read-erase-modify-write process associated with garbage collection.

For conceptual clarity, full memory blocks 241, partial memory blocks 242, and erased memory blocks 243 are shown physically grouped with like memory blocks in flash memory device 240. In reality, each full memory block 241, partial memory block 242, and erased memory block 243 can be located anywhere within flash memory device 240, and of course is not limited to being disposed adjacent to like memory blocks. Furthermore, flash memory device 240 typically includes many more memory blocks than shown in FIG. 3, for example hundreds or thousands of memory blocks. Drive controller 210 generally requires a significant portion of the memory blocks of flash memory device 240 (20-30%, for example) to be erased memory blocks 243 during operation to facilitate garbage collection. This is because the garbage collection process can become very inefficient due to exaggerated write amplification when flash memory device 240 has an inadequate number of erased memory blocks 243 available. Specifically, write amplification increases wear on flash memory device 240 and extends the duration of the garbage collection process. Consequently, in operation, drive controller 210 uses minimum erased block threshold 211 so that garbage collection (i.e., the generation of additional erased memory blocks 243) begins when the number of erased memory blocks 243 in flash memory device 240 is below minimum erased block threshold 211. Thus, minimum erased block threshold 211 allows drive controller 210 to initiate garbage collection before drive controller 210 accepts and writes so much data to flash memory device 240 that the garbage collection process operates inefficiently (i.e., too slowly and with too much write amplification).

Similarly, drive controller 210 uses maximum erased block threshold 212 to stop garbage collection operations, so that the number of erased memory blocks 243 in flash memory device 240 does not exceed a target fraction of flash memory device. Otherwise, without additional write and delete commands from host 110, the garbage collection process will continue until essentially all memory blocks in flash memory are either full memory blocks 241 or erased memory blocks 243. Such aggressive garbage collection invariably involves performing garbage collection on partial memory blocks 242 that include very few invalid pages 251, which greatly exaggerates write amplification in flash memory device 240. Thus, maximum erased block threshold 212 allows drive controller 210 to halt garbage collection before the garbage collection process operates in a regime causing too much write amplification.

In some embodiments, minimum erased block threshold 211 and/or maximum erased block threshold 212 are provided by host 110 to drive controller 210, either at startup off SSD 140 and/or during operation. In this way, host 110 can control the garbage collection process of SSD 140 based on performance of SSD 140 and/or of data storage system 130 as a whole. For example, when data storage system 130 includes a large number of other SSDs besides SSD 140, a relatively long time interval may elapse between write commands being sent to SSD 140. Consequently, a lower minimum erased block threshold 211 can be provided to SSD 140, since drive controller 210 has more time to perform garbage collection and make space available in flash memory device 240 for the next write command. In such embodiments, minimum erased block threshold 211 may be set below normal over-provisioning values typically associated with operation of flash memory device 140.

Over-provisioning in SSD 140 may be defined as the difference between the physical capacity of flash memory device 240 and the logical capacity presented to host 110. During garbage collection and/or wear-leveling in flash memory device 240, the additional data storage space provided by over-provisioning helps reduce write amplification, increase endurance of flash memory device 240, and increase performance of SSD 140. There are several ways in which over-provisioning can be implemented in flash memory device 140.

First, NAND flash chips include at least about 7% more physical data storage capacity than what is reported to a host. This disparity is simply due to the physical capacity being reported to a host in gigabytes (1×10E9 bytes) even though solid-state storage device are typically assembled in powers of two, and therefore are formed in gibibytes (which are approximately 1.073 10E9 bytes). Thus, a 128 GB SSD with 0% over-provisioning would report 128,000,000,000 bytes available to the host, but would in fact include 7.037% additional memory blocks available for use during garbage collection.

Second, over-provisioning may be provided inherently by an SSD manufacturer. For example, an SSD manufacturer might publish a usable size for an SSD having 128 GB of actual capacity as either 100 GB, 120 GB or 128 GB, in which case the over-provisioning for such a drive is 28%, 7% and 0%, respectively. It is noted that such over-provisioning does not generally include the additional 7.37% of capacity available from the difference between the decimal gigabytes and binary gibibytes.

Third, over-provisioning may be provided from known free space on the drive, for example on the order of about 25 or 30%, to gain endurance and performance at the expense of reduced capacity of the drive. For example, such free space may be identified by the host or operating system associated with an SSD using the TRIM command, which allows the SSD to be aware of memory blocks that are available for use when a host deletes data. Alternatively, some SSDs provide a utility that permit a host to select such additional over-provisioning.

As noted, the value of minimum erased memory block threshold 211 may be set below some or all of the over-provisioning levels described above. When host 110 is coupled to an array of SSDs, such as data storage system 130, host 110 can estimate the time interval during which write commands are sent to other SSDs, and therefore how much time a particular SSD has to perform garbage collection before again receiving write commands. Consequently, host 110 can reduce the value of minimum erased memory block threshold 211, when appropriate, to implement over-provisioning as low as the 7% over-provisioning normally provided by the difference between the decimal gigabytes and binary gibibytes, a level of over-provisioning that is nominally referred to as 0% over-provisioning. In this way, when an SSD has sufficient time to generate erased memory blocks before received more write commands, the effective capacity of the SSD is significantly increased.

According to one or more embodiments, SSD 140 is configured to begin garbage collection in flash memory device 240 when an initiation command is received from host 110. Thus, host 110 can, under some or all circumstances, control when garbage collection in SSD 140 is initiated. In this way, host 110 prevents SSD 140 from initiating garbage collection while host 110 is writing to SSD 140, which significantly reduces write performance. For example, in the embodiment illustrated in FIG. 1, host 110 sends write commands to SSD 140A, which include sufficient data to convert most or all of erased memory blocks 243 of SSD 140A to full memory blocks 241. Then, host 110 sends a command to SSD 140B (or any other of SSDs 140B-140D) to stop garbage collection and prepare to receive data, sends write commands to SSD 140B, and sends a garbage collection initiation command to SSD 140A, so that SSD 140A begins garbage collection. The above-described process can then be repeated for SSDs 140C and 140D. Thus, host 110 controls garbage collection in an SSD of data storage system 130 by halting garbage collection in the SSD shortly before sending write commands to the SSD and by initiating garbage collection in the SSD when no longer sending write commands to the SSD.

Figure 4:
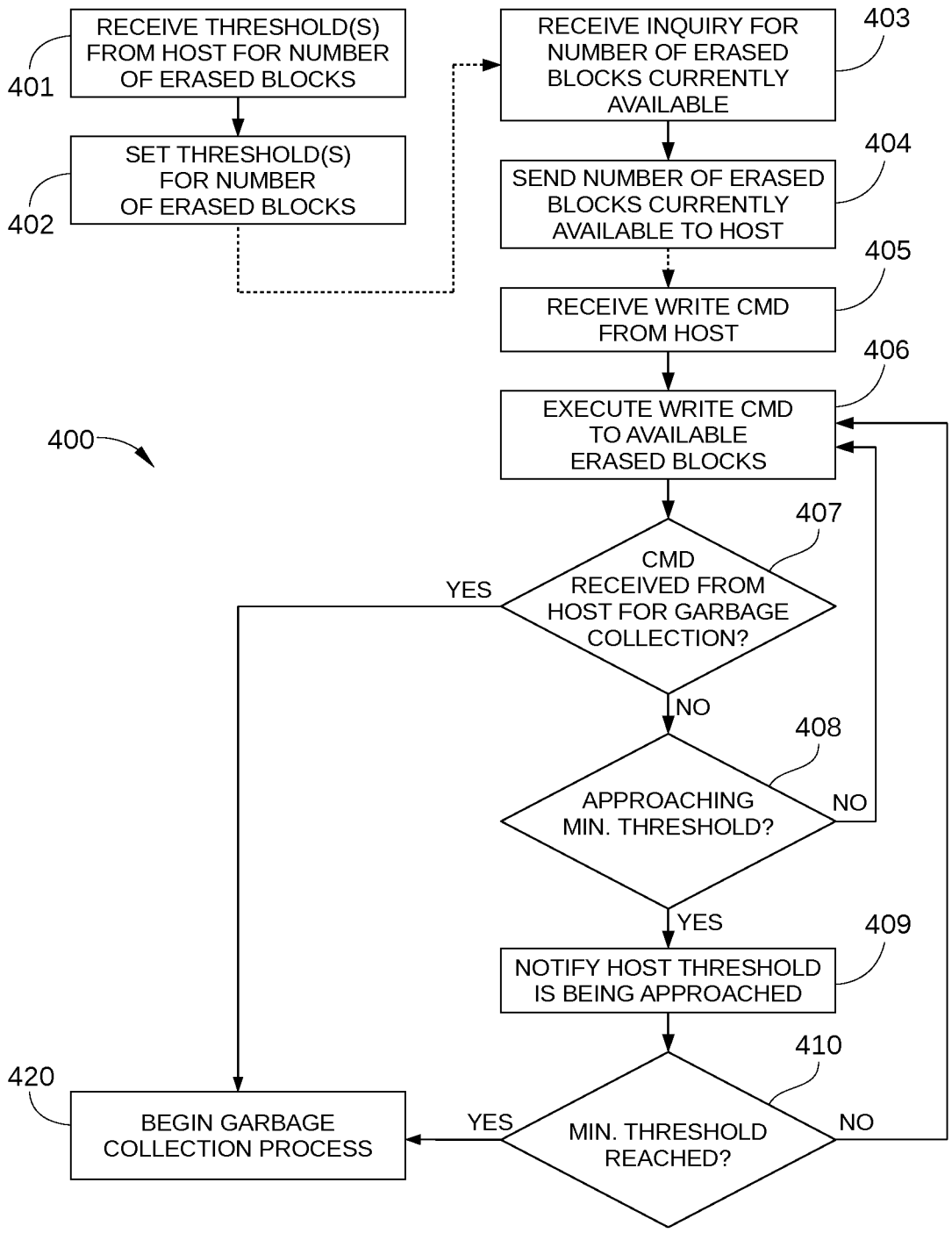
FIG. 4 sets forth a flowchart of method steps for storing data in response to a write command from a host, according to one or more embodiments.

FIG. 4 sets forth a flowchart of method steps for storing data in response to a write command from a host, according to one or more embodiments. The method steps of FIG. 4 may be performed in a data storage system that includes an array of non-volatile solid-state storage devices similar to SSD 140. Although the method steps are described in conjunction with SSD 140 of FIG. 2, persons skilled in the art will understand the method steps may be performed with other types of data storage systems. While described below as performed by drive controller 210, control algorithms for the method steps may reside in and/or be performed by a flash manager device for flash memory device 240 or any other suitable control circuit or system associated with SSD 140.

As shown, a method 400 begins at step 401, in which drive controller 210 receives values for minimum erased block threshold 211 and/or maximum erased block threshold 212 from host 110. In step 402, drive controller 210 sets minimum erased block threshold 211 and/or maximum erased block threshold 212 to the values received from host 110 in step 401. In some embodiments, step 401 and step 402 may be performed upon startup or initialization of data storage system 130. Alternatively or additionally, step 401 and step 402, may be performed repeatedly, for example at regular intervals or in response to particular events. In some embodiments, prior to step 401, drive controller 210 receives a system interface command from host 110 that includes a field assigned to enable and disable SSD 140 to receive and respond to an inquiry for a number of erased memory blocks currently available in flash memory device 240.

In step 403, drive controller 210 receives an inquiry from host 110 for the number of erased memory blocks currently available in flash memory device 240. The inquiry may be sent as a system interface command to SSD 140, where the system interface command includes a field assigned to prompt SSD 140 to respond to the inquiry. For example, the inquiry may be implemented as a SATA SMART Read Log command to a special log page, a SAS Log Sense command, or an NVMe Get Log Page command. In some embodiments, the system interface command may be modified with a special field for prompting drive controller to reply with the number of erased memory blocks currently available. In step 404, drive controller sends to host 110 the number of erased memory blocks currently available in flash memory device 240 for storing data, for example using a modified system interface command that includes a field for the number of erased memory blocks.

In step 405, drive controller 210 receives a write command or a series of write commands from host 110. In step 406, drive controller 210 begins executing the write commands received in step 405. It is noted that because host 110 is aware of the number of erased memory blocks currently available for storing data in flash memory device 240, in some embodiments, host 110 limits the quantity of write data sent to SSD 140 in step 406 so that the number of erased memory blocks in flash memory device 240 does not drop below minimum erased block threshold 211.

In step 407, which may occur after a predetermined quantity of data from the write commands have been written to flash memory device 240, drive controller 210 checks whether an initiation command from host 110 has been received. If yes, method 400 proceeds to step 420. If no, method 400 proceeds to step 408.

In step 408, drive controller 210 checks whether the number of erased blocks currently available in flash memory device 240 is less than a notification threshold that is greater than minimum erased block threshold 211. Thus, drive controller 210 determines if the number of erased blocks currently available in flash memory device 240 is approaching minimum erased block threshold 211. In some embodiments, the notification threshold may be based on the total number of memory blocks in flash memory device 240 (e.g., 1% of the total number of memory blocks), and in other embodiments the notification threshold may be based on minimum erased block threshold 211. If the number of erased blocks currently available in flash memory device 240 is less than the notification threshold, method 400 proceeds to step 409. If the number of erased blocks currently available in flash memory device 240 is equal to or greater than the notification threshold, method 400 proceeds to step 406 and continues executing the write command received in step 405.

In step 409, drive controller 210 notifies host 110 that minimum erased block threshold 211 is being approached and SSD 140 will soon begin garbage collection to generate additional erased memory blocks in flash memory device 140. In step 410, drive controller 210 checks whether minimum erased block threshold 211 has actually been reached (i.e., is the number of erased memory blocks 243 currently available in flash memory device 240 less than minimum erased block threshold 211). If yes, method 400 proceeds to step 420. If no, method 400 proceeds back to step 406, and execution of the write command received in step 405 continues.

In step 420, drive controller 210 begins garbage collection operations. In some embodiments, drive controller 210 continues garbage collection until the number of erased blocks in flash memory device 240 is equal to or greater than maximum erased block threshold 212.

Figure 5:
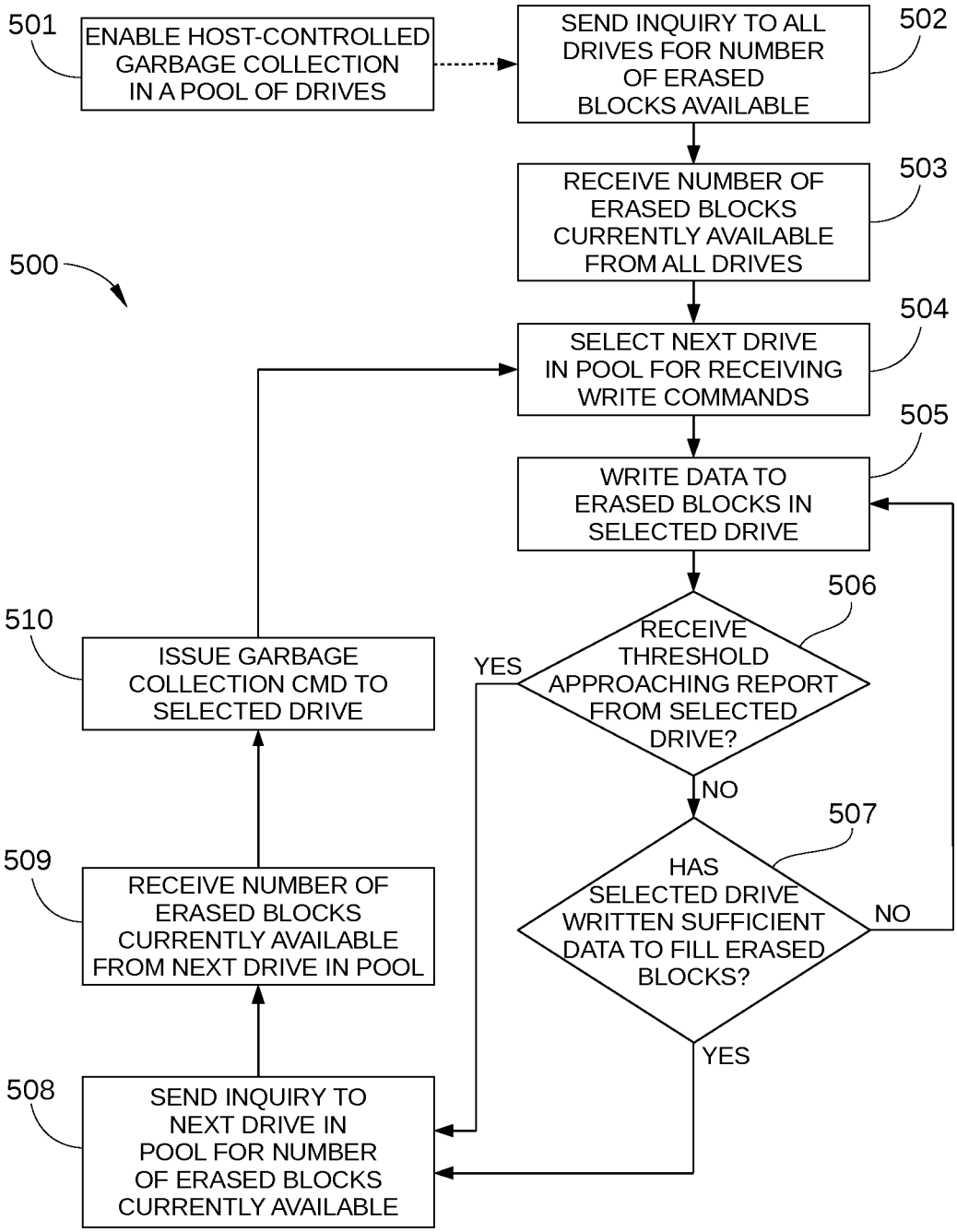
FIG. 5 sets forth a flowchart of method steps for writing data to a data storage device that includes a pool of non-volatile solid-state devices, according to one or more embodiments.

FIG. 5 sets forth a flowchart of method steps for writing data to a data storage device that includes a pool of non-volatile solid-state devices, according to one or more embodiments. The method steps of FIG. 5 may be performed in a data storage system that includes an array of non-volatile solid-state storage devices, such as data storage system 130. Although the method steps are described in conjunction with data storage system 130 of FIG. 1, persons skilled in the art will understand the method steps may be performed with other types of data storage systems. While described herein as performed by host 110, control algorithms for the method steps may reside in and/or be performed by an operating system or any other suitable control circuit or system associated with data storage system 130.

As shown, a method 500 begins at step 501, in which host 110 enables host-controlled garbage collection in some or all of SDDs 140A-140D. For example, in some embodiments, host 110 sends a modified system interface command (e.g., a SATA, SAS, or NVMe command) that includes a field assigned to enable each SSD that receives the system interface command to receive and respond to an inquiry from host 110 for the number of available erased memory blocks currently in the SSD. In some embodiments, in step 501 host 110 may also send values for minimum erased block threshold 211 and/or maximum erased block threshold 212, thereby controlling the point at which the SSDs automatically begin garbage collection (based on minimum erased block threshold 211) and automatically halt garbage collection (based on maximum erased block threshold 212). These values may be communicated to each SSD using any technically feasible approach. For example, in embodiments in which a SATA protocol is used as the system interface, host 110 may use a Set Features command that is modified with special fields, and drive controller 210 may be configured to set minimum erased block threshold 211 and maximum erased block threshold 212 based on the values in such fields. Similarly, in embodiments in which a SAS protocol is used as the system interface, host 110 may use a modified Mode Select command that is modified with special fields, and in embodiments in which an NVMe protocol is used as the system interface, host 110 may use a Set Features command that is modified with special fields.

In step 502, host 110 sends an inquiry to the SSDs of data storage system 130 (i.e., SSDs 140A-140D) for the number of currently erased memory blocks 243 available in each, i.e., how many erased memory block 243 in each SSD can be used to store data before the number of erased memory blocks 243 falls below minimum erased block threshold 211. It is noted that minimum erased block threshold 211 may be set significantly lower than conventional over-provisioning levels.

In step 503, host 110 receives the requested number of erased memory blocks currently in each SSD of data storage system 130. In some embodiments, the number of erased memory blocks so received may be embedded in a modified system interface command from each SSD. For example, in step 502, host 110 may issue a SATA, SAS, or NVMe command that includes a field requesting a smart log page that includes the number of erased memory blocks currently in each SSD, where information in the SMART log page is updated by drive controller 240 for each SSD. Then, in step 503, the updated SMART log page received by host 110.

In step 504, host 110 selects an SSD (e.g., SSD 140A) for receiving write commands. Initially, such as at startup of data storage system 130, host 110 may select the SSD with the greatest number of erased memory blocks available. Subsequently, when method 500 returns to step 504, host 110 may selects the SSD with the greatest number of erased memory blocks or the next SSD in the series of SSDs 140A-140D (e.g., SSD 140B).

In step 505, host 110 writes data to the selected SSD, which then stores the write data in erased memory blocks 243 in flash memory device 240. In step 506, host 110 determines whether the selected SSD has reported that the minimum erased block threshold 211 is approaching, i.e., that erased memory blocks 243 in flash memory device 240 are almost exhausted. If yes, method 500 proceeds to step 508. If no, method 500 proceeds to step 507.

In step 507, host 110 determines whether the quantity of data written to the selected SSD is sufficient to fill the number of erased memory blocks 243 that the selected SSD reported in step 504. If yes, method 500 proceeds to step 508. If no, method 500 proceeds to step 505. In some embodiments, host 110 determines the quantity of data written to the selected SSD by monitoring a SMART log maintained by drive controller 210 of the selected SSD.

In step 508, host 110 sends an inquiry to the next SSD in the pool (e.g., SSD 140B) for the number of erased memory blocks 243 currently available. In some embodiments, host 110 determines the number of erased memory blocks 243 currently available in the next SSD by monitoring a SMART log maintained by drive controller 210 of that SSD. In step 509, host 110 receives the requested number of erased memory blocks currently in the next SSD in the pool. In some embodiments, the number of erased memory blocks so received may be embedded in a modified system interface command as described above in step 504.

In step 510, host 110 issues an initiation command to the selected SSD. Any technically feasible approach may be used that is compatible with the particular protocol employed between host 110 and drive controller 210, including various vendor-specific commands that can facilitate the start of garbage collection in a particular SSD. For example, in embodiments in which a SATA protocol is used as the system interface, host 110 may use a SMART Write log to update a flag or value in a special log page, and drive controller 210 may be configured to begin garbage collection upon detecting the updated flag or value in the special log page. Alternatively, a modified TRIM command may be issued by host 110 that includes a special flag or other indicator that drive controller 210 is configured to recognize as a signal to begin garbage collection (e.g., LBA and length=0). In embodiments in which a SAS protocol is used as the system interface, host 110 may send a Send Diagnostic command or an Unmap command that includes a special indicator (e.g., LBA and length=0) to initiate garbage collection.

In some embodiments, in step 510 host 110 also notifies the next SSD in the pool of SSDs (e.g., SSD 140B) to halt any ongoing garbage collection operations and prepare to receive write commands. In other embodiments, host 110 may notify the next SSD in the pool of SSDs to halt ongoing garbage collection operations prior to step 510, for example, in step 506, when host 110 determines that the selected SSD has reported that the minimum erased block threshold 211 is approaching. Alternatively, host 110 may notify the next SSD in the pool of SSDs to halt ongoing garbage collection operations when a specific number of erased memory blocks 243 drops below a predetermined number.

Thus, by monitoring how many erased memory blocks are available in an SSD of data storage system 130 before and/or during the execution of a write command to the SSD, host 110 can write data to the SSD sufficient to utilize a portion of the erased memory blocks 243 in the flash memory device 240 of the SSD without reducing the number of erased memory blocks 243 below minimum erased memory block threshold 211 (which triggers garbage collection). In addition, because host 110 also monitors how many erased memory blocks are available in the next SSD of data storage system 130 (steps 508 and 509), host 110 can continue essentially uninterrupted writing to data storage system 130 by sending write commands to the next SSD.

Furthermore, host 110 can help tune the performance of data storage system 130. Specifically, host 110 can dynamically adjust values for minimum erased memory block threshold 211 and maximum erased memory block threshold 212, based on the performance of each and/or all of SSDs 140A-140D. For example, in some embodiments, host 110 is configured to cycle through SSDs 140A-140D individually, sending write commands to a single SSD until essentially all available erased memory blocks 243 are exhausted, then sending subsequent write commands to the next SSD until essentially all available erased memory blocks 243 are exhausted in that SSD, and so on. As described above in step 510, host 110 initiates garbage collection operations in the SSD when host 110 stops sending write data to the SSD, and these garbage collection operations continue until host 110 begins writing data to the SSD again or until the maximum erased memory block threshold 212 is met or exceeded. Depending on the number of SSDs in data storage system 130 and on the average rate of data being written to data storage system 130, host 110 can adjust the value of maximum erased memory block threshold 212 and/or minimum erased memory block threshold 211 for a particular SSD so that more or fewer erased memory blocks 243 are available when host 110 begins writing to that SSD again. In this way, SSD performance and wear can be optimized for the current rate of data being stored and the number of SSDs in data storage system 130.

While the foregoing is directed to embodiments of the present invention, other and further embodiments of the invention may be devised without departing from the basic scope thereof, and the scope thereof is determined by the claims that follow.

I claim:

[1. A host computing device connectable to a data storage device and including a data storage storing a control algorithm to cause the host computing device to carry out a method of writing data to the data storage device, which includes a pool of non-volatile solid-state devices, the method comprising:

sending an inquiry to a first non-volatile solid-state device in the pool of non-volatile solid-state devices for a number of erased memory blocks in the first non-volatile solid-state device;

after receiving from the first non-volatile solid-state device the number of erased memory blocks in the first non-volatile solid-state device, writing to the first non-volatile solid-state device a quantity of data equal to or less than the number of erased memory blocks received from the first non-volatile solid-state device;

in response to an acknowledgement that writing the quantity of data to the first non-volatile solid-state device has completed, sending a command to the first non-volatile solid-state device to begin generating erased memory blocks in the first non-volatile solid-state device; and while writing the quantity of data to the first non-volatile solid-state device, sending an inquiry to a second non-volatile solid-state device in the pool of non-volatile solid-state devices for a number of erased memory blocks in the second non-volatile solid-state device.]

[2. The host computing device of claim 1, wherein the method further comprises:

upon receiving from the first non-volatile solid-state device a notification that a number of erased memory blocks currently present in the first non-volatile solid-state storage device is less than a notification threshold, sending a command to the first non-volatile solid-state device to begin generating erased memory blocks in the first non-volatile solid-state device.]

[3. The host computing device of claim 2, wherein the notification threshold corresponds to a number of erased memory blocks in the first non-volatile solid-state storage device that is greater than a minimum threshold value of erased memory blocks at which the controller begins generating erased blocks in the first non-volatile solid-state storage device.]

[4. The host computing device of claim 3, wherein the method further comprises, prior to sending the inquiry to the first non-volatile solid-state device, sending the minimum threshold value to the first non-volatile solid-state device.]

[5. The host computing device of claim 2, wherein the method further comprises, while writing the quantity of data to the first non-volatile solid-state device, turning into a state for receiving from the second non-volatile solid-state device the number of erased memory blocks in the second non-volatile solid-state device.]

[6. The host computing device of claim 5, wherein the method further comprises, in response to the acknowledgement that writing the quantity of data to the first non-volatile solid-state device has completed, writing to the second non-volatile solid-state device a quantity of data equal to or less than the number of erased memory blocks received from the second non-volatile solid-state device.]

[7. The host computing device of claim 1, wherein the method further comprises, prior to sending the inquiry to the first non-volatile solid-state device, enabling the first non-volatile solid-state device to receive and respond to the inquiry.]

[8. The host computing device of claim 7, wherein enabling the first non-volatile solid-state device to receive and respond to the inquiry comprises sending a system interface command to the first non-volatile solid-state device, the system interface command including a field assigned to enable the first non-volatile solid-state device to receive and respond to the inquiry.]

[9. The host computing device of claim 8, wherein the system interface command comprises one of a Serial Advanced Technology Attachment (SATA) command, a Serial Attached Small Computer System Interface (SAS) command, or a Non-Volatile Memory Express (NVMe) command.]

*10. A method of controlling an array of solid-state drives (SSDs) by a host device, the array of SSDs including a first SSD and a second SSD, the method comprising:*

*issuing a first command to at least one SSD to request that the at least one SSD notify the host device of an amount of available area to write data in the at least one SSD, the first command being not issued for carrying out data writing from the host device to the at least one SSD;*

*identifying an SSD that has a greater amount of available area among the array of SSDs, the identified SSD being the first SSD;*

*issuing a second command to the first SSD, the second command being a command with which a first amount of data is to be transmitted to the first SSD; and*

*before transmitting the first amount of data to the first SSD is completed, issuing a third command to the second SSD, the third command being a command to stop a garbage collection in the second SSD.*

*11. The method according to claim 10, wherein*

*transmitting the first amount of data to the first SSD and issuing the third command to the second SSD occur in parallel.*

*12. The method according to claim 10, wherein the method further comprises:*

*after issuing the third command to the second SSD, issuing a fourth command to the second SSD, the fourth command being a command with which a second amount of data is to be transmitted to the second SSD.*

*13. The method according to claim 10, wherein the method further comprises:*

*issuing a fifth command to the first SSD to request that the first SSD notify the host device of an amount of available area to write data in the first SSD, wherein the fifth command is not issued for carrying out data writing from the host device to the first SSD; and*

*determining a timing to issue the third command to the second SSD according to the notified amount of available area to write data in the first SSD.*

*14. The method according to claim 10, wherein identifying an SSD that has a greater amount of available area among the array of SSDs comprises:*

*identifying an SSD that has a greatest amount of erased memory area available among the array of SSDs.*

*15. The method according to claim 10, wherein the method further comprises:*

*issuing a sixth command to the first SSD to set a first threshold value to enable the first SSD to start a garbage collection when the amount of available area to write data in the first SSD becomes less than the first threshold value;*

*identifying a first value as the first threshold value when the array of SSDs includes a first number of SSDs; and*

*identifying a second value as the first threshold value, the second value being less than the first value, when the array of SSDs includes a second number of SSDs, the second number being larger than the first number.*

*16. The method according to claim 15, wherein the method further comprises:*

*determining the first threshold value according to an average rate of data being written to the array of SSDs.*

*17. The method according to claim 15, wherein the method further comprises:*

*issuing a seventh command to set a third threshold value so that the first SSD notifies the host device when the amount of available area to write data in the first SSD becomes less than the third threshold value, the third threshold value being larger than the first threshold value.*

*18. The method according to claim 17, wherein the method further comprises:*

*in response to a notification from the first SSD when the amount of available area to write data in the first SSD becomes less than the third threshold value,*

*issuing an eighth command to the second SSD to suspend a garbage collection in the second SSD.*

* * * * *